(12) United States Patent
Tsai et al.

(10) Patent No.: US 9,142,690 B2
(45) Date of Patent: Sep. 22, 2015

(54) SEMICONDUCTOR DEVICE HAVING A BONDING PAD AND SHIELD STRUCTURE AND METHOD OF MANUFACTURING THE SAME

(71) Applicant: Taiwan Semiconductor Manufacturing Company, Ltd., Hsin-Chu (TW)

(72) Inventors: Shuang-Ji Tsai, Tainan (TW);
Dun-Nian Yaung, Taipei (TW);
Jen-Cheng Liu, Hsin-Chu (TW);
Wen-De Wang, Chiayi County (TW);
Jeng-Shyan Lin, Tainan (TW);
Cheng-Ying Ho, Chiayi County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/215,296

(22) Filed: Mar. 17, 2014

(65) Prior Publication Data
US 2014/0199804 A1  Jul. 17, 2014

Related U.S. Application Data

(62) Division of application No. 13/112,828, filed on May 20, 2011, now Pat. No. 8,710,612.

(51) Int. Cl.
*H01L 31/02* (2006.01)
*H01L 21/30* (2006.01)
(Continued)

(52) U.S. Cl.
CPC .......... *H01L 31/02005* (2013.01); *H01L 24/06* (2013.01); *H01L 27/1464* (2013.01); *H01L 27/14621* (2013.01); *H01L 27/14623* (2013.01); *H01L 27/14636* (2013.01); *H01L 31/02327* (2013.01); *H01L 24/03* (2013.01); *H01L 24/05* (2013.01); *H01L 27/14627* (2013.01); *H01L 27/14632* (2013.01); *H01L 27/14685* (2013.01); *H01L 27/14687* (2013.01); *H01L 27/14698* (2013.01); *H01L 2224/0345* (2013.01); *H01L 2224/0391* (2013.01);
(Continued)

(58) Field of Classification Search
CPC .................... H01L 27/14623; H01L 27/14636
USPC ..................... 438/70; 257/228, 459
See application file for complete search history.

(56) References Cited

U.S. PATENT DOCUMENTS 7,129,532 B2   10/2006   Lee
7,507,598 B2   3/2009    Weng et al.
(Continued)

FOREIGN PATENT DOCUMENTS

WO    WO 2009/151274    12/2009

*Primary Examiner* — Kimberly Rizkallah
*Assistant Examiner* — Alexander Belousov
(74) *Attorney, Agent, or Firm* — Haynes and Boone, LLP

(57) ABSTRACT

A method of fabricating a semiconductor device includes providing a device substrate having a front side and a back side corresponding to a front side and a back side of the semiconductor device, forming, on the front side of the device substrate, a metal feature, forming, on the back side of the device substrate, an insulating layer, forming, on the back side of the semiconductor device, a trench exposing the metal feature, forming a bonding pad in the trench in electrical communication with the metal feature, and forming, on the insulating layer, a metal shield, in which the metal shield and the bonding pad have different thicknesses relative to each other.

20 Claims, 14 Drawing Sheets

(51) Int. Cl.
*H01L 31/0232* (2014.01)
*H01L 27/146* (2006.01)
*H01L 23/00* (2006.01)

(52) U.S. Cl.
CPC ............... *H01L 2224/03831* (2013.01); *H01L 2224/04042* (2013.01); *H01L 2224/05567* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2924/00014* (2013.01); *H01L 2924/01327* (2013.01); *H01L 2924/14* (2013.01)

(56) References Cited

U.S. PATENT DOCUMENTS

| | | | |
|---|---|---|---|
| 7,659,595 B2 | 2/2010 | Shiau et al. | |
| 7,807,493 B2 | 10/2010 | Kao | |
| 8,076,172 B2 | 12/2011 | Akiyama | |
| 8,120,081 B2 | 2/2012 | Murakoshi | |
| 8,300,127 B2 | 10/2012 | Akiyama | |
| 8,344,471 B2 | 1/2013 | Tseng et al. | |
| 8,564,135 B2 | 10/2013 | Pyo | |
| 2009/0185060 A1* | 7/2009 | Akiyama | 348/294 |
| 2012/0292728 A1 | 11/2012 | Tsai | |

* cited by examiner

SEMICONDUCTOR DEVICE HAVING A BONDING PAD AND SHIELD STRUCTURE AND METHOD OF MANUFACTURING THE SAME

CROSS-REFERENCE TO RELATED APPLICATIONS

The present application is a divisional application of U.S. patent application Ser. No. 13/112,828, filed May 20, 2011, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a bonding pad) often have separate requirements than other features of an IC. For example, a bonding pad must have sufficient size and strength to withstand physical contact due to such actions as probing or wire bonding. There is often a simultaneous desire to make features relatively small (both in size and in thickness). For example, in applications such as a complementary metal-oxide semiconductor (CMOS) image sensor, it is often desired to have one or more relatively thin metal layers, for example a metal layer of aluminum copper (AlCu) that is patterned to form a bonding pad and shield structure for cross-talk prevention. In one conventional example, a metal shield and a bond pad are the same thickness and are relatively thin. However, a problem with thin metal layers is that the bond pads formed in these layers may exhibit peeling or other defects. A need therefore exists to accommodate the various requirements of these features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

Figure 1:
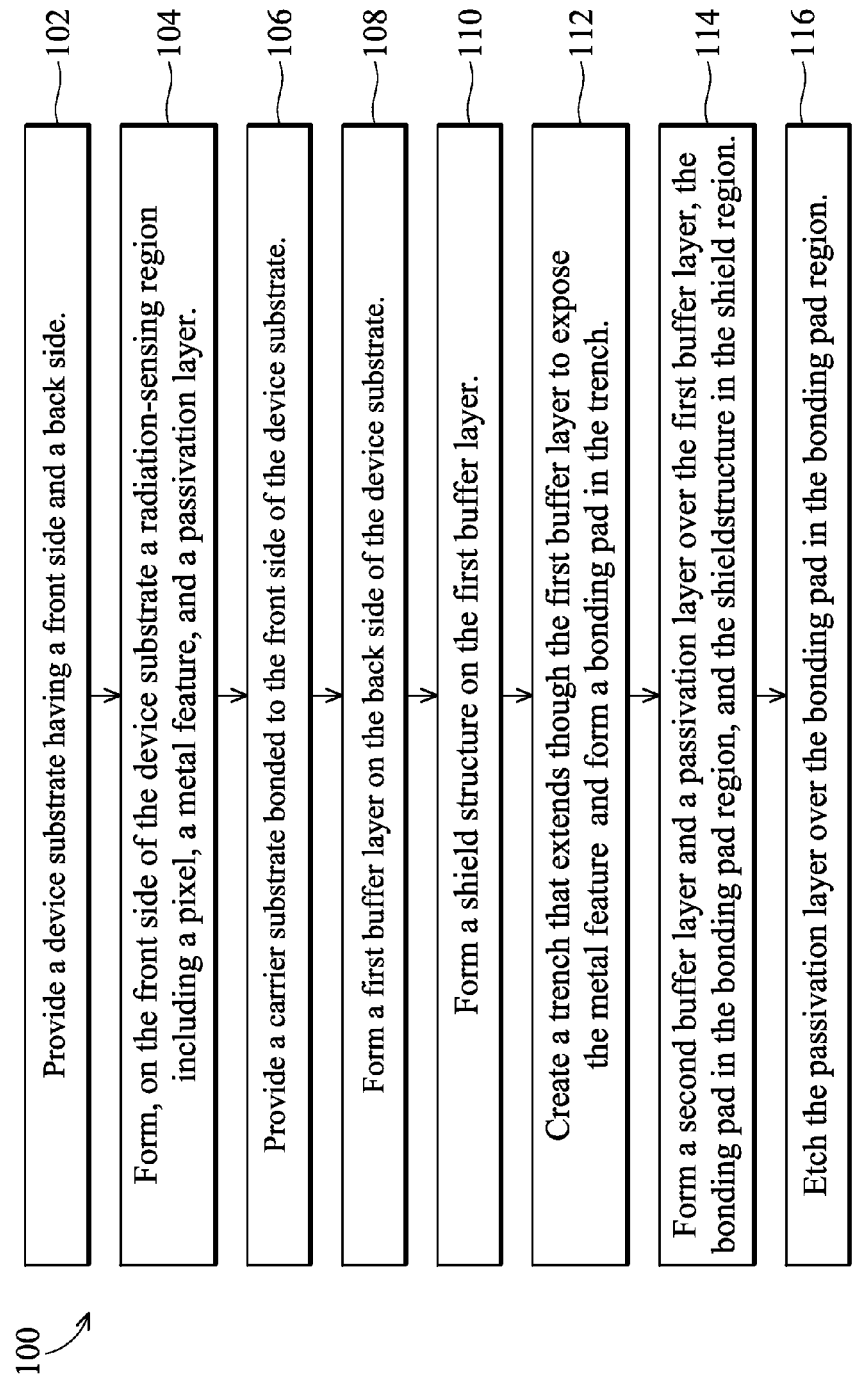
FIG. 1 is a flowchart illustrating a method of forming a semiconductor device according to one embodiment of the present disclosure.

According to one embodiment, a semiconductor device includes a device substrate having a front side and a back side corresponding to a front side and a back side of the semiconductor device, a metal feature formed on the front side of the device substrate, a bonding pad disposed on the back side of the semiconductor device and in electrical communication with the metal feature, and a shield structure disposed on the back side of the device substrate in which the shield structure and the bonding pad have different thicknesses relative to each other.

According to another embodiment, a semiconductor device includes a substrate having a bonding region and a non-bonding region and having a front side and a back side corresponding to a front side and a back side of the semiconductor device, a metal feature disposed on the front side of the substrate, and a first conductive material disposed within a trench on the back side of the semiconductor device in the bonding region. The first conductive material is in electrical communication with the metal feature and has a first thickness. The semiconductor device further includes a second conductive material disposed on the back side of the substrate in the non-bonding region, in which the second conductive material has a second thickness, and in which the first thickness is different from the second thickness.

According to a further embodiment, a method of fabricating a semiconductor device includes providing a device substrate having a front side and a back side corresponding to a front side and a back side of the semiconductor device, forming, on the front side of the device substrate, a metal feature, forming, on the back side of the semiconductor device, a trench exposing the metal feature, and forming a bonding pad in the trench in electrical communication with the metal feature. The method further includes forming, on the back side of the device substrate, a metal shield, in which a thickness of the metal shield is less than a thickness of a metal layer of the bonding pad.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present disclosure are semiconductor devices with image sensors. An example device includes a back-side illuminated (BSI) image sensor device. The following disclosure will continue with this example to illustrate various embodiments of the present invention. It is understood, however, that the invention should not be limited to a particular type of device, except as specifically claimed.

Furthermore, it should be understood that the figures described herein show a single BSI unit, and there may be many BSI units the same as or similar to such BSI unit manufactured on a wafer. In fact, the process steps described below include wafer-level process steps, and while the embodiments herein refer to a single BSI unit, it is understood that the same process steps may be applied to the entire wafer to produce many BSI units on the wafer.

In one example embodiment, a BSI image sensor device includes a silicon substrate with a front side and a back side. A multi-layer interconnect (MLI) structure is formed on the front side for electrical routing. The MLI includes multiple metal features separated by Inter Metal Dielectric (IMD) layers. A carrier wafer may be bonded to a passivation layer that, itself, is formed over the MLI structure on the front side.

Continuing with the example embodiment, the back side of the silicon substrate includes a radiation-sensing area, a shielding area, and a bonding area. The radiation-sensing area includes a radiation sensing device, such as a device that senses visible or non-visible light. In some example embodiments, the radiation-sending device may be formed on a front-side of the semiconductor substrate.

The bonding area includes a bonding pad formed in a trench on the back side of the semiconductor device. The trench exposes a metal feature in the MLI, and the bonding pad is formed so as to contact the metal feature. A bonding wire may connect the bonding pad to an electrical contact formed on the carrier wafer. Such electrical connections may provide communication from the sensor to other components outside the device.

The example device further has a metal shield structure formed in the shielding area. In this embodiment, the metal shield includes a metal portion that overlays the silicon substrate between the bonding area and the radiation-sensing area. One function of the metal shield is to block some photons from striking the radiation sensing device in order to reduce or eliminate optical cross-talk.

Unlike some conventional devices, this example embodiment includes a metal shield and a bonding pad that are made in separate processes. Such feature may provide one or more advantages. For instance, in some embodiments, the thickness of the bonding pad may be increased relative to the thickness of the metal shield. A reduced thickness of the metal shield may help to reduce a stripe defect during color filter processes. Furthermore, an increased thickness of the bonding pad may help to prevent peeling and package failure. However, the scope of embodiments is not limited to devices that have a bonding pad that is thicker than the metal shield, as other embodiments may reverse the thickness relationship.

Other embodiments may include wafer-level methods for manufacturing image sensor devices, including the example BSI device described above. An example method includes forming the bonding pad before forming the metal shield. Another example method includes forming the metal shield before forming the bonding pad. In either embodiment, two separate mask processes are used to form such back side metal features. Thus, rather than having a single thickness for a metal layer that forms both a bonding pad and a shield, various embodiments can make a metal shield structure of one thickness and a bonding pad of another thickness. Furthermore, various embodiments may also include devices in which the metal shield and the bonding pad are made of different materials.

Further process steps may include using a bond wire to electrically connect the bonding pad to a contact pad on the carrier substrate, forming a color filter, and forming a microlens over the color filter and radiation sensor. Additionally, some embodiments include dicing the wafer to create individual dies that may then be packaged. Various embodiments are described in more detail below.

Referring to FIG. 1, a method 100 for fabricating a semiconductor device is described according to various aspects of the present disclosure. Method 100 includes a process for forming the metal shield before forming the bonding pad.

The method 100 begins with step 102 in which a device substrate having a front side and a back side is provided, the front side and the back side corresponding to a front side and a back side, respectively, of the semiconductor device. The method 100 continues with step 104 in which sensors are formed in the device substrate, using, e.g., a front-side process. Also, at step 104 a metal feature (such as a metal feature in a MLI) and a passivation layer are formed on the device substrate. The method 100 continues with step 106 in which a carrier substrate is provided and bonded to the front side of the device substrate. The method 100 continues at step 108 in which a first buffer layer, which may be transparent, is formed on the back side of the device substrate.

The method 100 continues at step 110 in which a first process, including deposition and etching, is performed to form a shield structure on the first buffer layer. The first process includes depositing a metal layer over the first buffer and then patterning the metal layer to form the shield structure. At step 112 a second buffer layer is formed over the shield structure. Step 114 continues with a second process, including deposition and etching, to pattern a bonding pad in the trench. In step 114, the second process includes depositing another metal layer and then patterning the metal layer to form the bonding pad. Further in block 114, the second buffer layer protects the shield structure during the patterning process for the bonding pad structure. At step 116 a passivation layer is formed over the second buffer layer, the bonding pad, and the shield structure. Further in step 116 an etch process removes a portion of the passivation layer to expose the bonding pad and the radiation sensing region.

Figure 2:
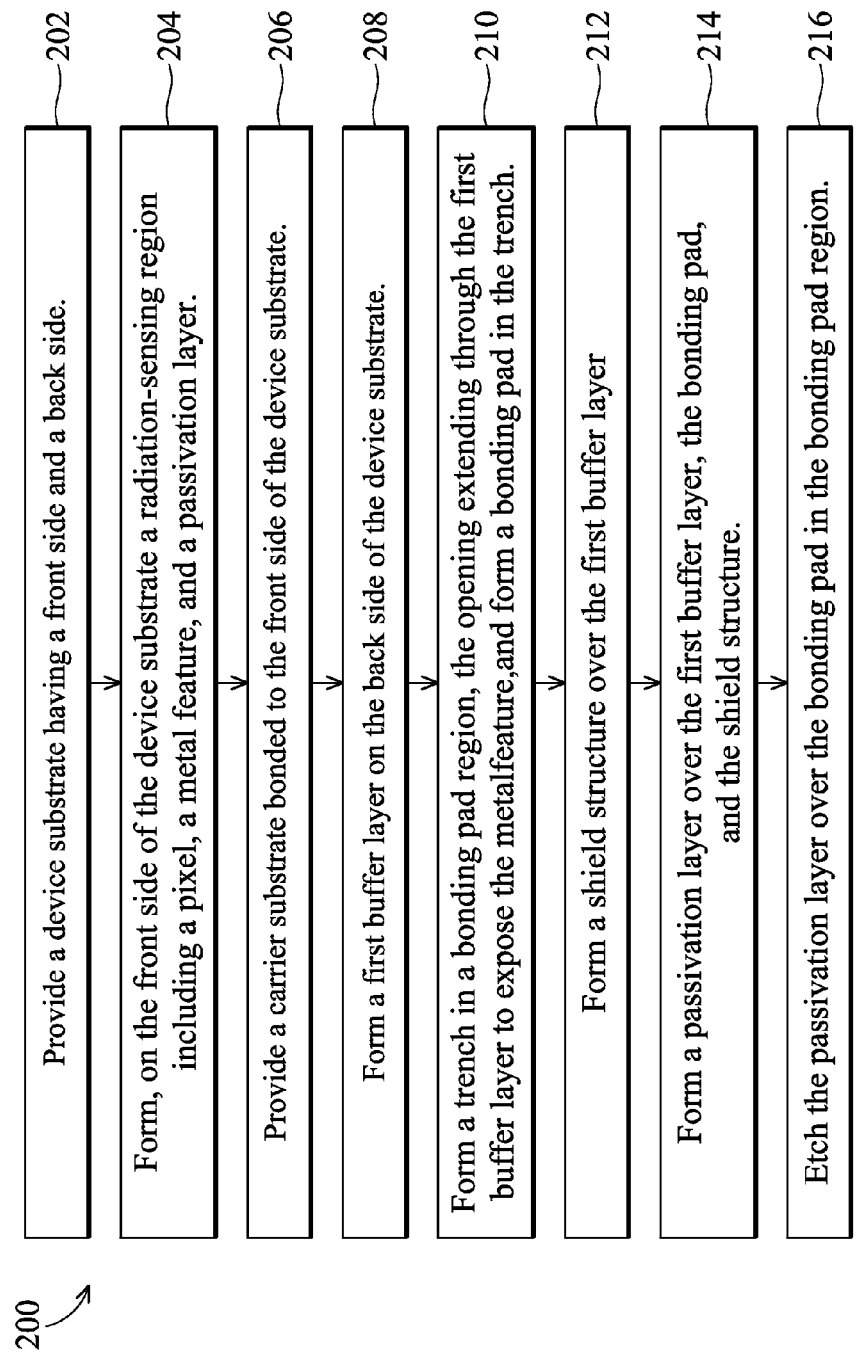
FIG. 2 is a flowchart illustrating a method of forming a semiconductor device according to another embodiment of the present disclosure.

FIG. 2 is a method 200 for fabricating a semiconductor device is described according to various aspects of the present disclosure. Method 200 includes a process for forming the bonding pad before forming the metal shield.

Steps 202-208 are similar to steps 102-108 of FIG. 1. The method 200 begins with step 202 in which a device substrate having a front side and a back side is provided. The method 200 continues with step 204 in which sensors are formed in the device substrate, using, e.g., a front-side process. Also, at step 204 a metal feature (such as in a MLI) and a passivation layer are formed on the device substrate. At step 206 a carrier substrate is provided and bonded to the front side of the device substrate. At step 208 a first buffer layer, which may be transparent, is formed on the back side of the device substrate.

At step 210 a a first process is performed to form a bonding pad on the back side. For instance, step 210 includes depositing a metal layer over the first buffer layer and then patterning the metal layer to form the bonding pad structure. At step 212 a second buffer layer is formed over the first buffer layer and the bonding pad. At step 214, a second process is performed to form a shield structure over the second buffer layer. In step 214, a second metal layer is deposited and then patterned to form the shield structure. The second buffer layer provides protection for the bonding pad region during patterning of the second metal layer to form the shield structure. At step 216 a passivation layer is formed over the second buffer layer, the bonding pad, and the shield structure. Further in step 216 an etch process removes a portion of the passivation layer (and in some instances, portions of the second buffer layer) to expose the bonding pad and the radiation sensing region.

Additional steps can be provided before, during, and after the method 100 and/or the method 200, and some of the steps described can be replaced or eliminated for other embodiments. The discussion that follows illustrates various embodiments of a semiconductor device (FIGS. 3-8) that can be fabricated according to the method 100 of FIG. 1 and other embodiments of a semiconductor device (FIGS. 9-14) that can be fabricated according to the method 200 of FIG. 2.

FIGS. 3 to 8 are diagrammatic sectional side views of one embodiment of a semiconductor device that is a back-side illuminated (BSI) image sensor device 300 at various stages of fabrication according to the method 100 of FIG. 1. The image sensor device 300 includes pixels (sensors) for sensing and recording an intensity of radiation (such as light) directed toward a back-side of the image sensor device 300. The image sensor device 300 may include a charge-coupled device (CCD), complimentary metal oxide semiconductor (CMOS) image sensor (CIS), an active-pixel sensor (APS), or a passive-pixel sensor. The image sensor device 300 may further include additional circuitry (not shown) and input/outputs (not shown) that are provided adjacent to the sensors for providing an operation environment for the sensors and for supporting external communication with the sensors. It is understood that FIGS. 3 to 14 have been simplified for a better understanding of the inventive concepts of the present disclosure and may not be drawn to scale.

Figure 3:
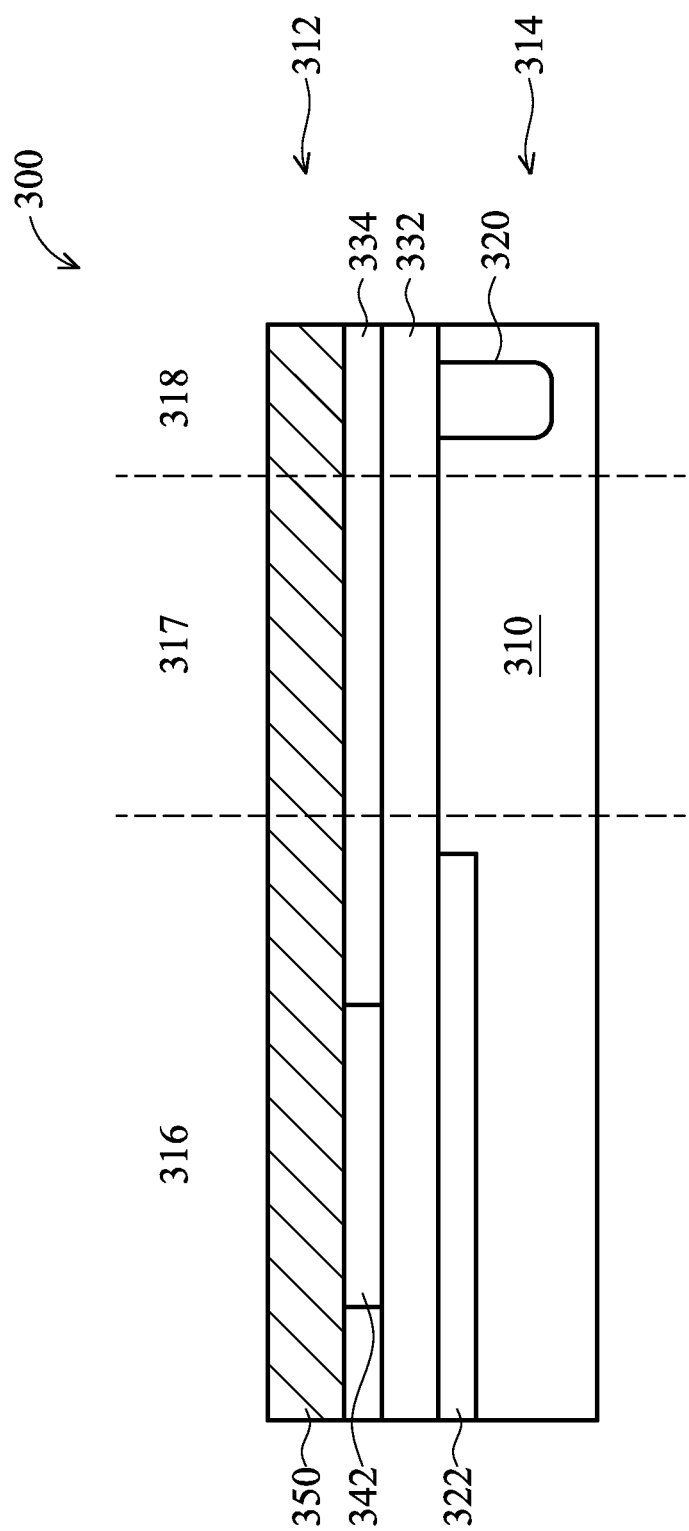
FIGS. 3 to 8 illustrate diagrammatic cross-sectional side views of one embodiment of a semiconductor device at various stages of fabrication according to the method of FIG. 1.

With reference to FIG. 3, the BSI image sensor device 300 includes a device substrate 310. The device substrate 310 has a front side 312 and a back side 314. The device substrate 310 may be a silicon substrate doped with a p-type dopant such as boron (for example a p-type substrate). Alternatively, the device substrate 310 may be another suitable semiconductor material. For example, the device substrate 310 may be a silicon substrate that is doped with an n-type dopant such as phosphorous or arsenic (an n-type substrate). The device substrate 310 may include other elementary semiconductors such as germanium and diamond and/or may include a compound semiconductor and/or an alloy semiconductor. Further, the device substrate 310 may include an epitaxial layer (epi layer, not shown), may be strained for performance enhancement, and may include a silicon-on-insulator (SOI, not shown) structure.

The device substrate 310 includes a bonding region 316, a shield region 317, and a radiation-sensing region 318. The broken lines in FIG. 3 designate an approximate boundary between the regions. The radiation-sensing region 318 is a region of the device substrate 310 where radiation-sensing devices are formed. The radiation-sensing region 318, for example, includes sensor 320. The sensor 320 is operable to sense radiation, such as an incident light (thereafter referred to as light, visible or invisible), that is projected toward the back side 314 of the device substrate 310. The sensor 320 includes a photodiode in the present embodiment. In other embodiments, the sensor 320 may include pinned photodiodes, photogates, reset transistors, source follower transistors, transfer transistors and/or the like. Further, some embodiments may have multiple sensors, and the sensors may be varied from one another to have different junction depths, thicknesses, and so forth. For the sake of simplicity, only sensor 320 is illustrated in FIG. 2, but it is understood that any number of sensors may be implemented in the device substrate 310. Where more than one sensor is implemented, the radiation-sensing region includes isolation structures that provide electrical and optical isolation between the adjacent sensors.

The shield region 317 is a region where one or more shield structures of the BSI image sensor device 300 will be formed in a subsequent processing step. The bonding region 316 is a region where one or more bonding pads of the BSI image sensor device 300 will be formed in a subsequent processing step, so that electrical connections between the BSI image sensor device 300 and external devices may be established. It is also understood that these regions 316, 317, and 318 extend vertically above and below the device substrate 310.

Referring back to FIG. 3, Inter Layer Dielectric (ILD) 322 is formed over the front side 312 of the BSI image sensor device 300. The ILD 322 may include any suitable dielectric material. For example, the ILD 322 may include silicon oxide or other dielectric. The ILD 322 may be formed by a process such as chemical vapor deposition (CVD), high density plasma chemical vapor deposition (HDPCVD), a plasma enhanced chemical vapor deposition (PECVD), atomic layer deposition (ALD), physical vapor deposition (PVD), combinations thereof, or other suitable processes.

An interconnect structure is formed over the front side of the device substrate 310. The interconnect structure includes patterned dielectric layers 332, 334 and conductive layer 342 that provides an interconnection between the various doped features, circuitry, and input/output of the image sensor device 300. In the present embodiment, the interconnect structure includes an interlayer dielectric (ILD) layer 332 and an intermetal dielectric (IMD) layer 334. The ILD layer 332 and the IMD layer 334 may include suitable dielectric material. For example, in the present embodiments, the ILD layer 332 and the IMD layer 334 includes a low dielectric constant (low-k) material, the material having a constant lower than that of thermal silicon oxide, though other dielectrics with higher constants may be used as well. The dielectric material may be formed by CVD, HDPCVD, and PECVD, combinations thereof, or other suitable processes.

IMD layer 334 includes contacts (not shown), vias (not shown) and metal feature 342. For the purposes of illustration, only one IMD layer and only one interconnect metal feature are shown in FIG. 3, it being understood that any number (n-number) of IMD layers and interconnect metal features may be implemented and that the IMD layer as illustrated is merely exemplary, and the actual positioning and configuration of the metal features and vias/contacts may vary depending on design needs.

Conductive features, such as contacts, vias, and metal feature 342 of the interconnect structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including CVD, HDPCVD, PECVD, ALD, PVD, combinations thereof, or other suitable processes. Other manufacturing techniques to form the aluminum interconnect may include photolithography processing and etching to pattern the conductive materials for vertical connection (for example, vias/contacts) and horizontal connection (for example, metal features). Alternatively, a copper multilayer interconnect may be used to form the metal patterns. A copper interconnect structure may include copper, copper alloy, titanium, titanium nitride, tantalum, tantalum nitride, tungsten, polysilicon, metal silicide, or combinations thereof. A copper interconnect may be formed by a technique including CVD, sputtering, plating, or other suitable processes.

Still referring to FIG. 3, in the present embodiment, passivation layer 350 is formed over the interconnect structure. If more than one layer is included in the interconnect structure, the passivation layer 350 may be formed over the front-most layer. The passivation layer 350 may include any suitable dielectric material. In the present embodiment, the passivation layer 350 includes silicon oxide or silicon nitride. The passivation layer 350 may be formed by CVD, HDPCVD, PECVD, combinations thereof, or other suitable processes. The passivation layer 350 may be planarized to form a smooth surface by a chemical mechanical polishing (CMP) process.

Figure 4:
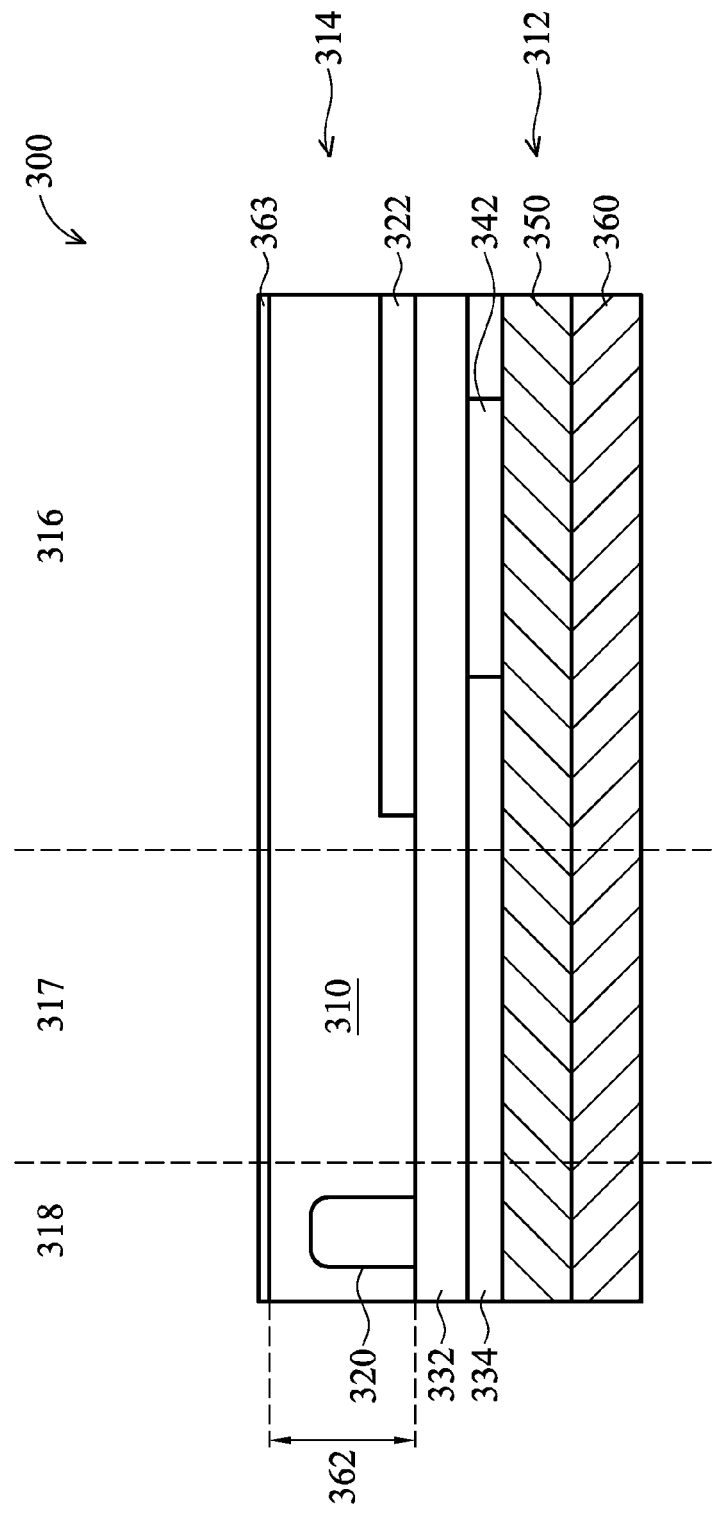

With reference to FIG. 4, a carrier substrate 360 is bonded with the device substrate 310 through the passivation layer 350, so that processing the back side 314 of the device substrate 310 can be performed. The carrier substrate 360 in the present embodiment is similar to the device substrate 310 and may include a silicon material. Alternatively, the carrier substrate 360 may include a glass substrate or another suitable material. The carrier substrate 360 may be bonded to the device substrate 310 by molecular forces—a technique known as direct bonding or optical fusion bonding—or by other bonding techniques known in the art, such as metal diffusion or anodic bonding.

Still referring back to FIG. 4, the passivation layer 350 provides electrical isolation between the device substrate 310 and the carrier substrate 360. The carrier substrate 360 provides protection for the various features formed on the front side 312 of the device substrate 310, such as the sensor 320. The carrier substrate 360 also provides mechanical strength and support for processing the back side 314 of the device substrate 310.

After bonding, the device substrate 310 and the carrier substrate 360 may optionally be annealed to enhance bonding strength. A thinning process may be performed to thin the device substrate 310 from the back side 314. The thinning process may include a mechanical grinding process and a chemical thinning process. A substantial amount of substrate material may be first removed from the device substrate 310 during the mechanical grinding process. Afterwards, the chemical thinning process may apply an etching chemical to the back side 314 of the device substrate 310 to further thin the device substrate 310 to a thickness 362. The device substrate 310 thickness 362 is in the range of about 1 micrometer to about 6 micrometers. In the present embodiment, the thickness 262 is about 2 micrometers, though any suitable thickness may be used in some embodiments. It is also understood that the particular thicknesses disclosed in the present disclosure serves as a mere example and that other thicknesses may be implemented depending on the type of application and design requirements of the image sensor device 200. Antireflective coating (ARC) layer 363 is formed over the back side 314 of the device substrate 310.

Figure 5:
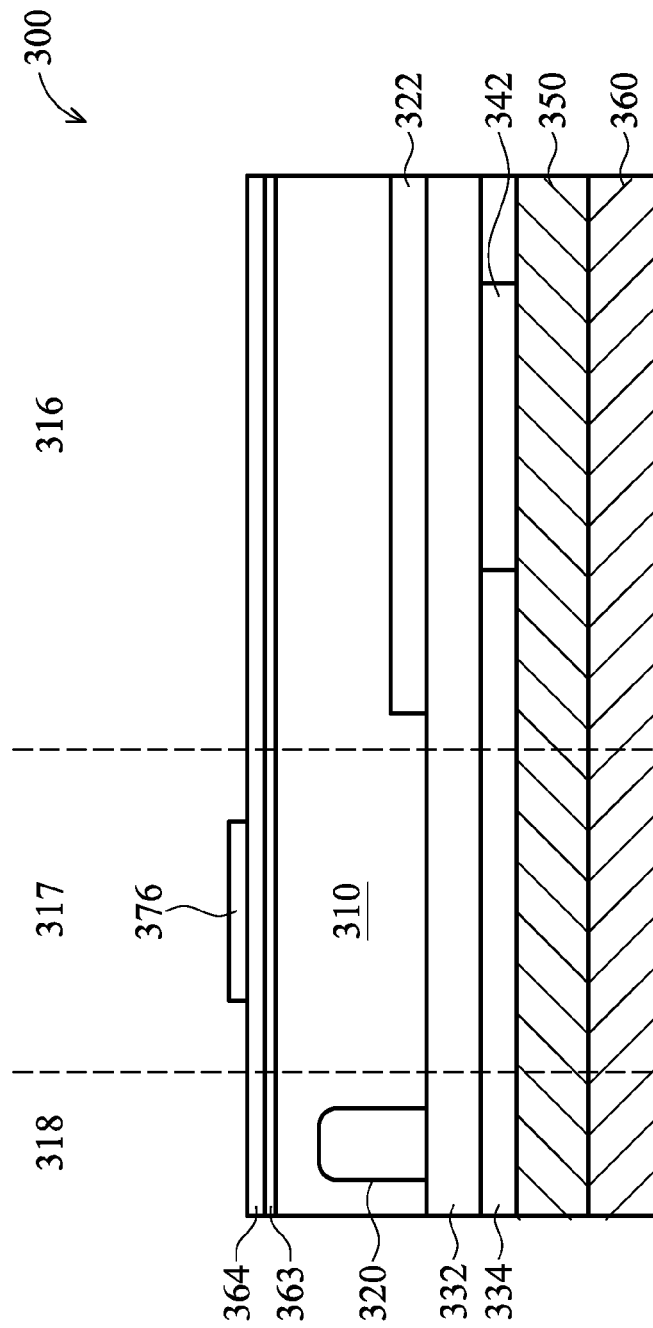

Moving to FIG. 5, buffer layer 364 is formed over the back side 314 of the device substrate 310. The buffer layer 364 may be transparent in some embodiments. The buffer layer 364 may include any suitable dielectric material. In the present embodiment, the buffer layer 364 is formed by a suitable process such as CVD. Buffer layer 364 may have any suitable thickness.

The process of FIG. 5 continues with forming shield structure 376. The shield structure 376 includes a metal material, such as aluminum, copper, aluminum-copper, titanium, tantalum, titanium nitride, tantalum nitride, tungsten, or an alloy thereof, and is formed using a suitable technique in the art, such as PVD, CVD, combinations thereof, or other suitable techniques. The material of shield structure 376 is patterned according to known techniques to provide a width and placement as shown. The shield structure 376 thickness may be in the range of about 500 Angstroms to about 10000 Angstroms, though other embodiments may use a different thickness for shield structure 376.

Figure 6:
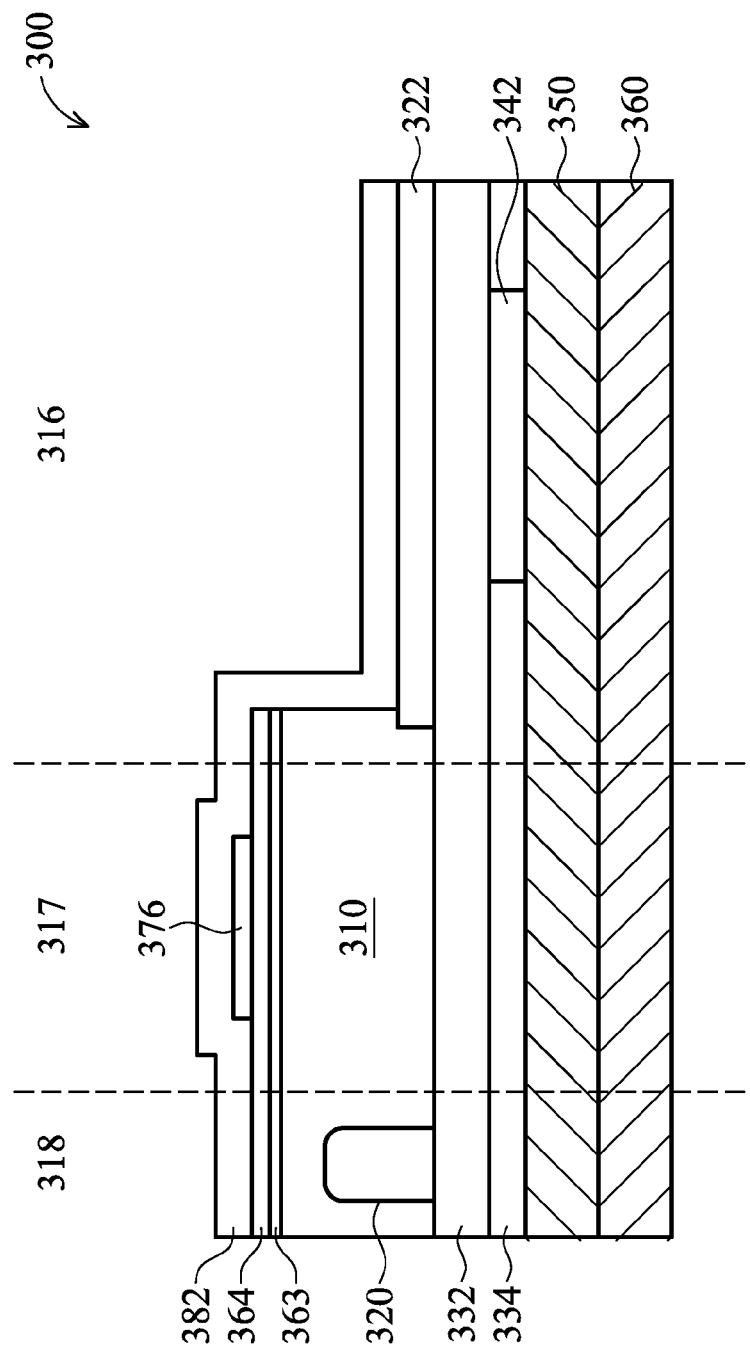

Moving to FIG. 6, photolithographic processes and etching processes are performed in bonding region 316 to remove portions of silicon substrate 310, ARC layer 363, and buffer layer 364. The photolithography process includes forming a photoresist layer on the ARC layer 263 and performing various masking, exposing, baking, and rinsing processes to form a patterned photoresist mask (not shown). The patterned photoresist mask protects portions of the ARC layer and the device substrate 310 therebelow in another etching process to remove material from the ARC layer and the device substrate 310. It is understood that the photoresist mask is stripped away after the removal of the material. The etching processes may include any etching process known in the art, such as a dry etching or wet etching processes.

Still referring to FIG. 6, a buffer layer 382 may be formed over the back side 314. In this example, the buffer layer 382 may also be formed on the buffer layer 364 and overlay the shield structure 376 in the shield region 317. Further in this example, the buffer layer 382 may be transparent. The buffer layer 382 may include any suitable dielectric material. The buffer layer 382 may be formed by a process, such as CVD or other suitable techniques.

Figure 7:
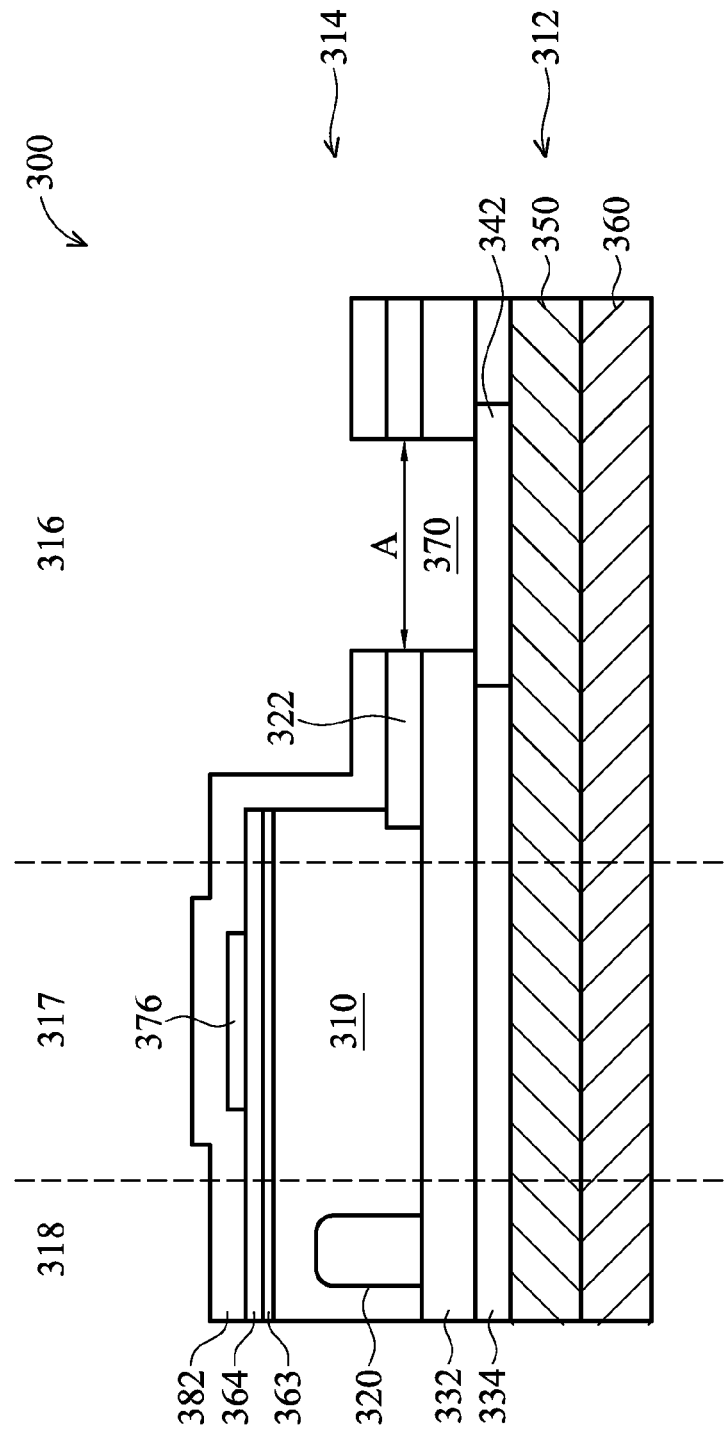

Moving to FIG. 7, further photolithographic and etching processes are performed to create trench 370, of width A, in bonding area 316. Trench 370 extends through buffer layer 382, isolation layer 322, and ILD layer 332 to expose a portion of metal feature 342. The trench 370 may be formed by an etching process known in the art, such as a dry etching or wet etching process. In the present embodiment, the opening 270 is formed by a dry etching process and has a width A in a range from about 5 microns to about 100 microns. It is understood that the depth of the trench 370 may depend on the total number of metal features of the interconnect structure and will thus vary in some embodiments with more than a single metal feature.

Figure 8:
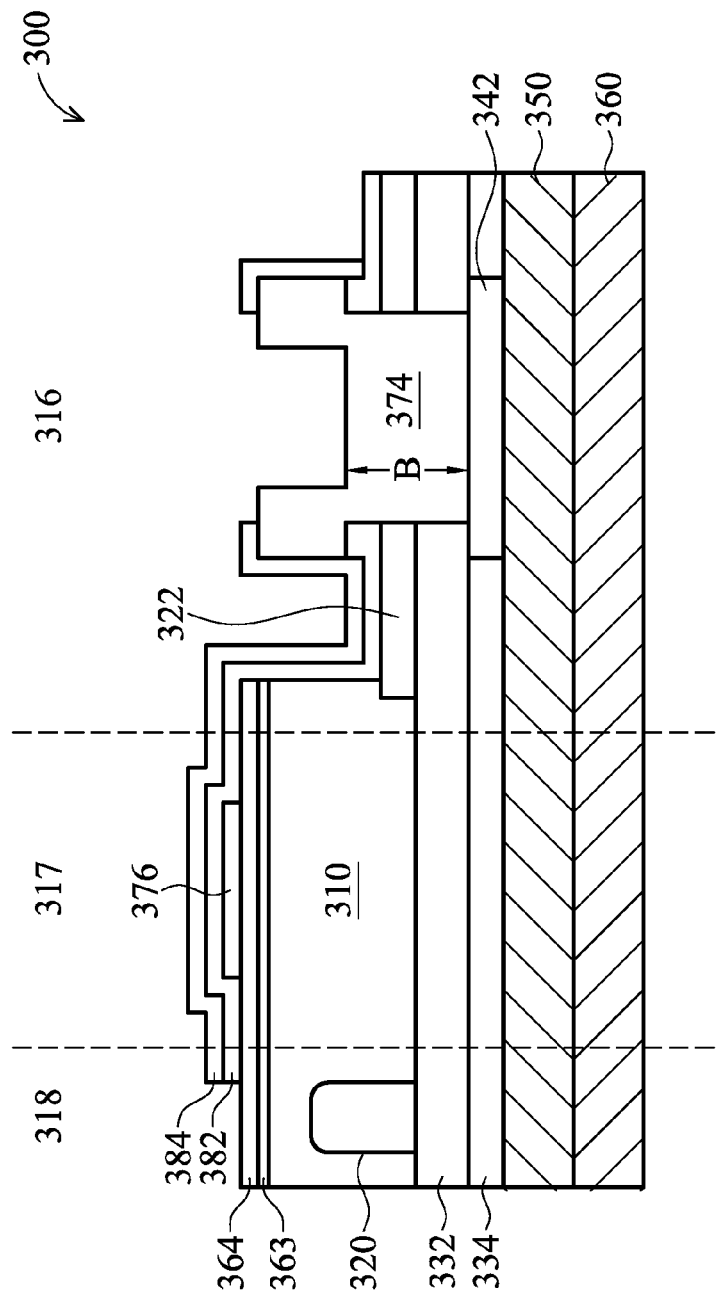

Moving to FIG. 8, another metal layer is formed and is patterned to create bonding pad 374. The bonding pad 374 has thickness B, which may be in the range of about 1000 Angstroms to more than 12000 Angstroms. In the present embodiment, the bonding pad 374 thickness B and the shield structure 376 thickness are quite different. Specifically, thickness B of bonding pad 374 is greater than that of shield structure 376. Similar to shield structure 376, the bonding pad 374 may include a metal material, such as aluminum, copper, aluminum-copper, titanium, tantalum, titanium nitride, tantalum nitride, tungsten, or an alloy thereof, and may be formed using a suitable technique in the art, such as PVD or other suitable techniques. However, in some embodiments, bonding pad 374 and shield structure 376 may be made out of different materials, since they are formed using two different processes.

As is illustrated in FIG. 8, the bonding pad 374 comes into contact with the metal feature 342 within the trench 370. Therefore, electrical connections between the image sensor device 300 and devices external to the image sensor device 300 may be established through the bonding pad 374. For the sake of simplicity, only one metal feature 342 is illustrated, but it is understood that any number (n-number) of metal features may be implemented in the interconnect structure. It is also understood that bonding pad 374 and trench 370 may extend to a front-most metal feature in embodiments with a MLI structure.

A passivation layer 384 is formed on the buffer layer 382 and also covers bonding pad 374. The passivation layer 384 may include any suitable dielectric material. In the present embodiment, the passivation layer 384 includes silicon oxide or silicon nitride. The passivation layer 384 may be formed by a process, such as CVD or other suitable techniques. A portion of the passivation layer 384 within the bonding region 316 is then patterned using suitable photolithography and etching process known in the art, including a wet etching process or a dry etching process, to expose the top of bonding pad 374.

Though not illustrated, additional processing may be performed to complete the fabrication of the image sensor device 300. For example, color filters (not shown) may be formed within the radiation-sensing region 318. The color filters may be positioned such that light is directed thereon and therethrough. The color filters may include a dye-based (or pigment based) polymer or resin for filtering a specific wavelength band of light, which corresponds to a color spectrum (e.g., red, green, and blue). Thereafter, micro-lenses (also not shown) may be formed over the color filters for directing and focusing light toward specific radiation-sensing regions in the device substrate 310, such as sensor 320. The micro-lenses may be positioned in various arrangements and have various shapes depending on a refractive index of material used for the micro-lens and distance from a sensor surface. It is also understood that the device substrate 310 may also undergo an optional laser annealing process before the forming of the color filters or the micro-lenses.

As mentioned above, another embodiment forms the bonding pad first and then forms the shield structure. FIGS. 9 to 14 illustrate such an example embodiment, where image sensor device 900 is similar image sensor device 200 (FIGS. 2-8). In the following embodiment it is understood that similar materials are used and similar processes may be used to form and pattern such materials. Accordingly, to the extent that a process is described more fully above, such description may not be repeated in the example below.

Figure 9:
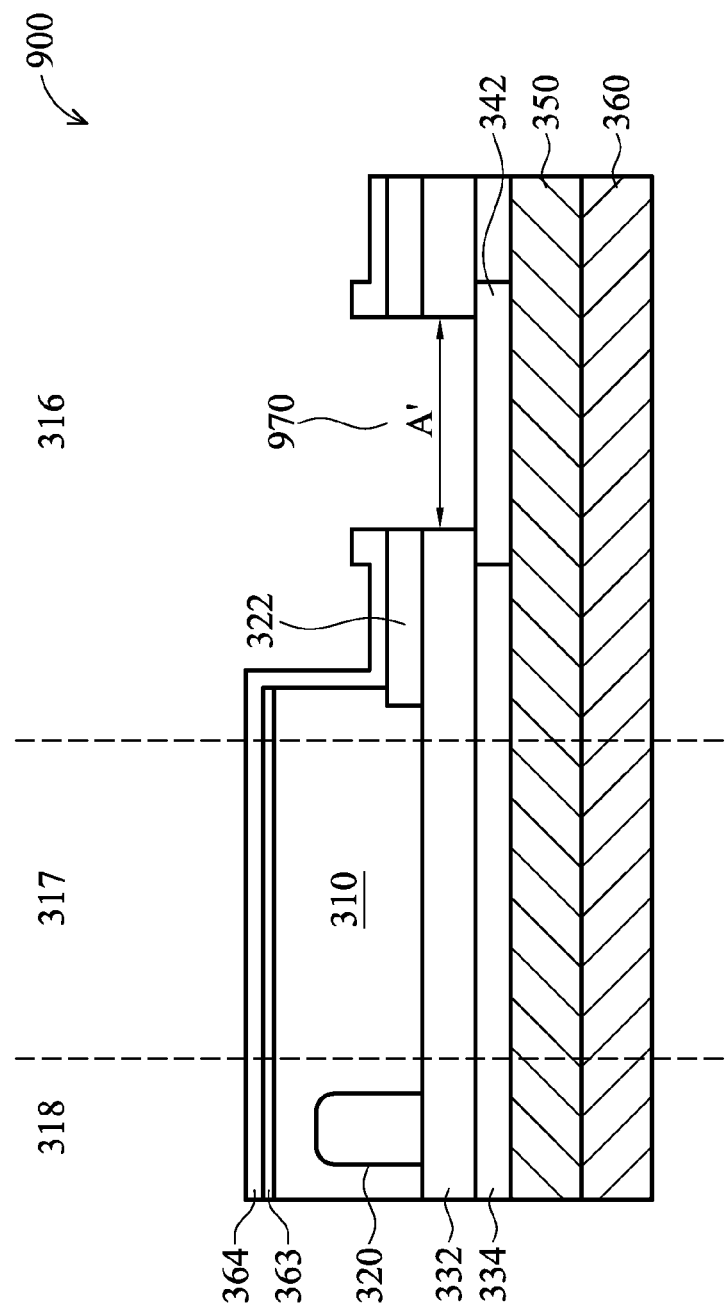
FIGS. 9 to 14 illustrate diagrammatic cross-sectional side views of one embodiment of a semiconductor device at various stages of fabrication according to the method of FIG. 2.

In FIG. 9, trench 970 is formed using similar processes as described above with respect to FIG. 7. Furthermore, width A may be the same as or similar to width A of FIG. 7.

Figure 10:
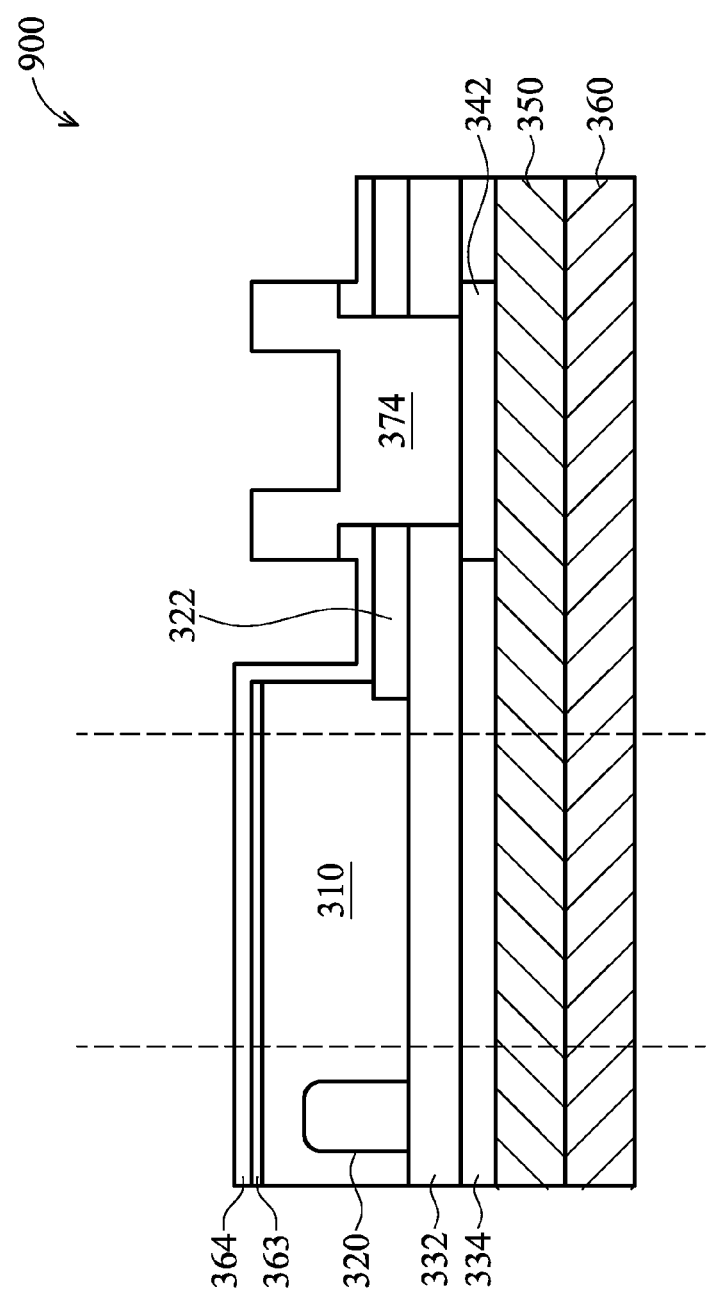

In FIG. 10, a metal layer is deposited and patterned to form bonding pad 374 having a thickness consistent with that described above with respect to FIG. 8.

Figure 11:
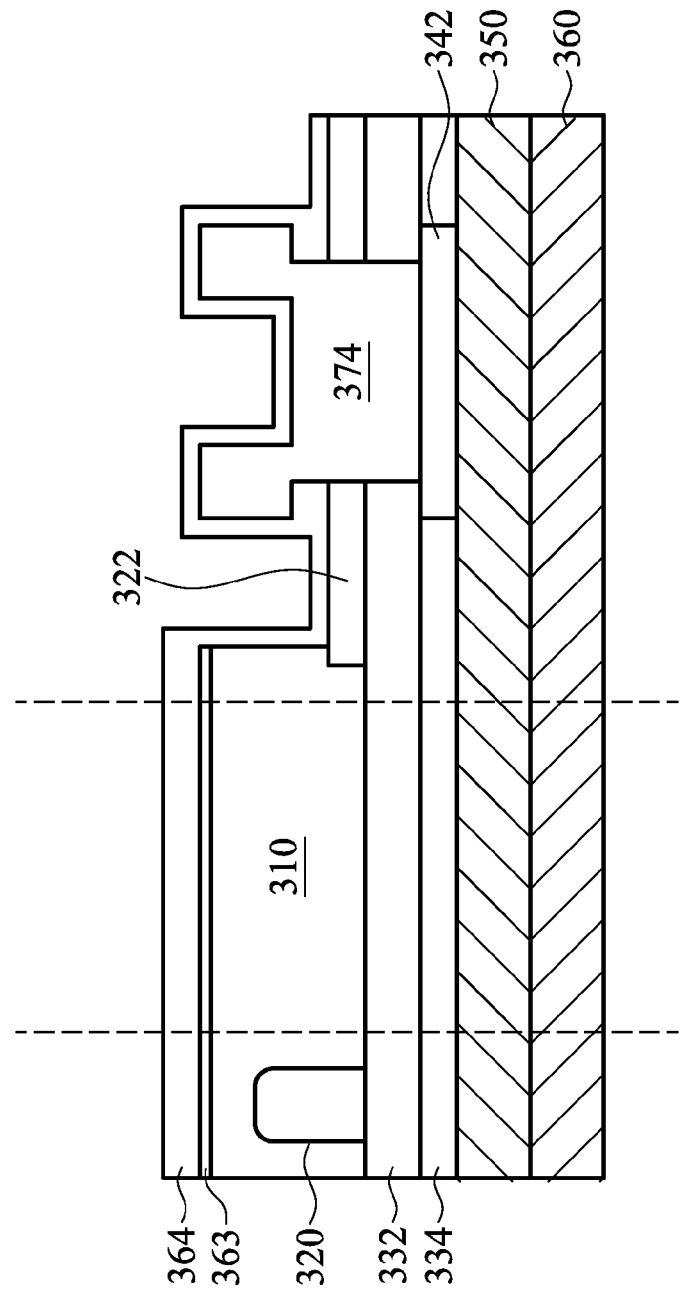

In FIG. 11, oxide is re-deposited to thicken buffer layer 364. In FIG. 11, buffer layer 364 covers bonding pad 374.

Figure 12:
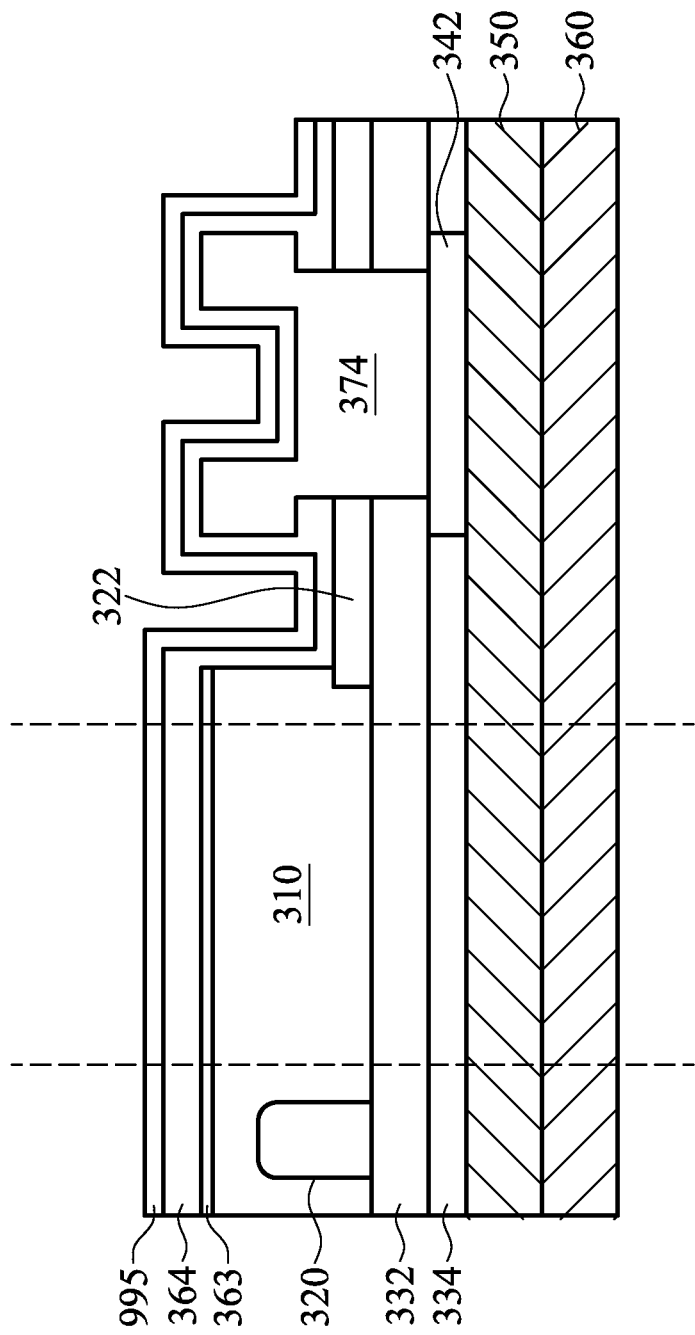
Figure 13:
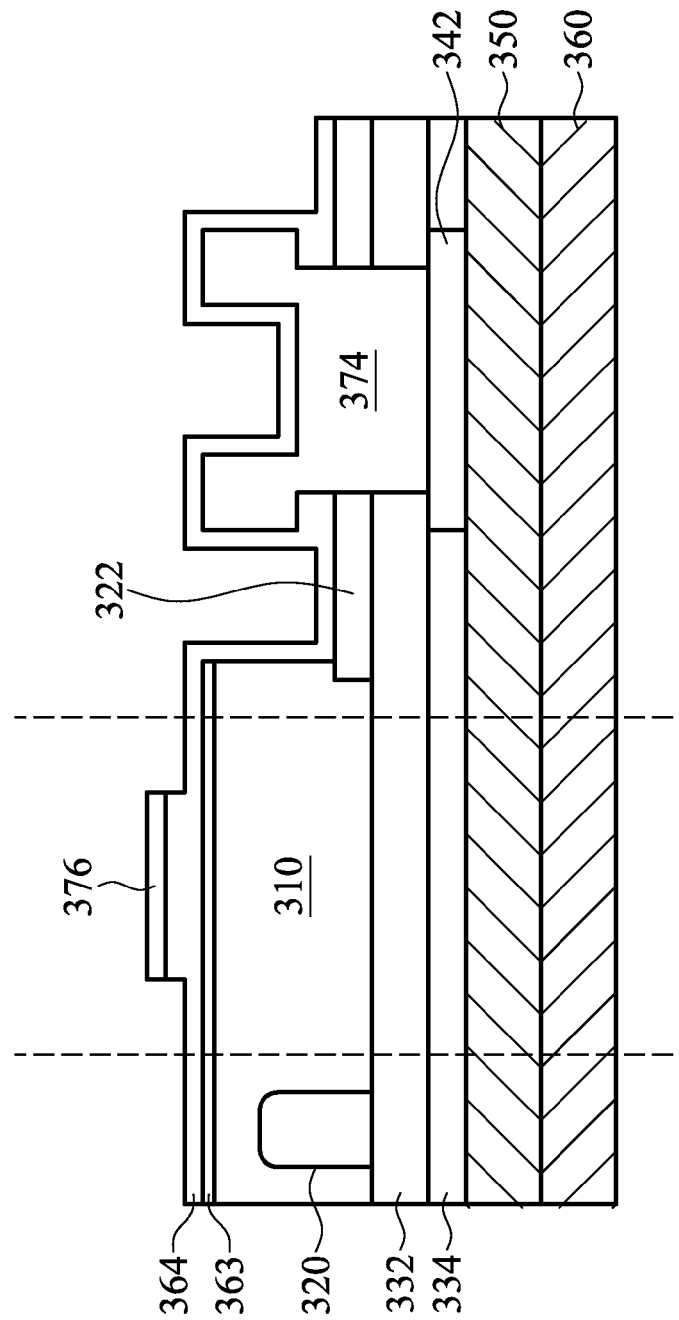

In FIG. 12, metal layer 995 is formed on buffer layer 364. Metal layer 995 may the same as or similar to the material described above for shield structure 376. In FIG. 13, metal layer 995 is patterned to form shield structure 376 that has a thickness consistent with that described above with respect to FIG. 5.

Figure 14:
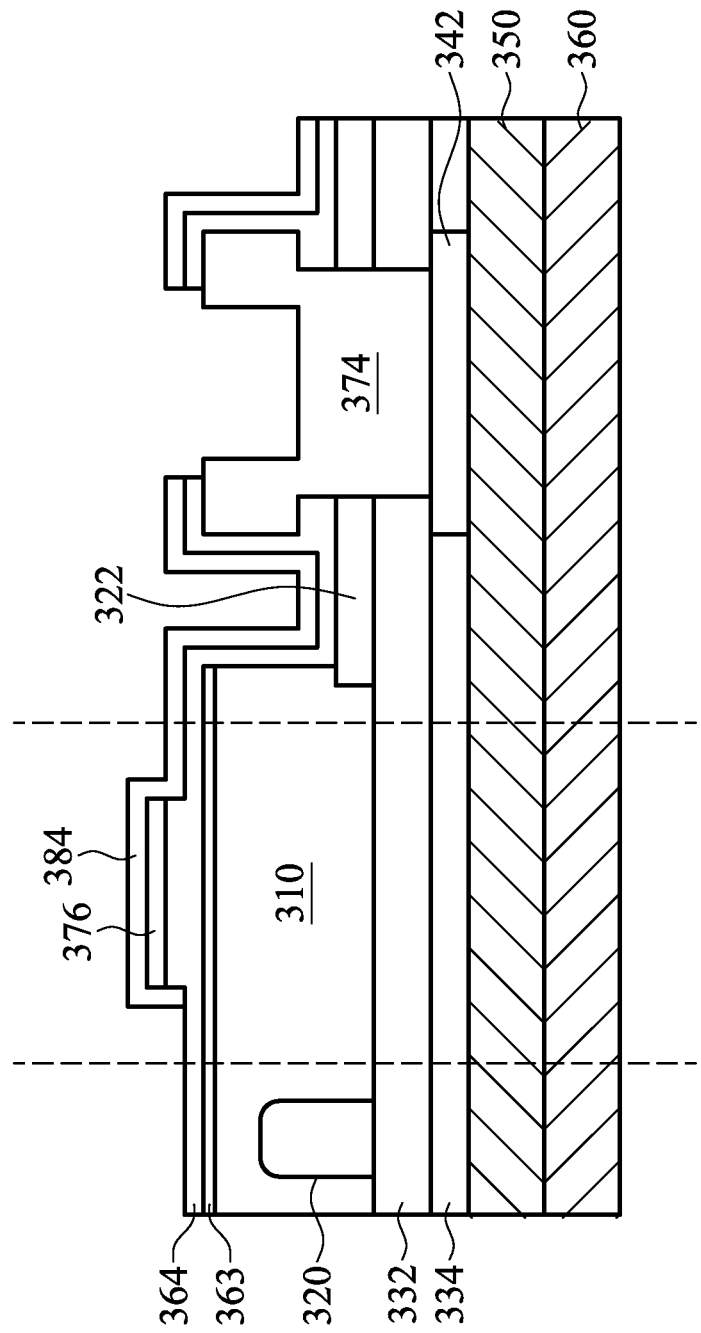

In FIG. 14, passivation layer 384 is deposited over shield structure 376 and buffer layer 364. Then, buffer layer 364 and passivation layer 384 are patterned to expose the top of bonding pad 374. Once again, further processing steps may include color filter processing, applying micro-lenses, dicing, etc.

Various embodiments may include one or more advantages over other conventional techniques. For instance, some embodiments of the present disclosure make a shield structure and a bonding pad in separate processes, thereby allowing for different thicknesses and/or materials to be used with the bonding pad and shield structure, respectively. For instance, some embodiments can make a relatively thin shield structure to reduce or eliminate stripe defects, while at the same time allowing for a relatively thick bonding pad to reduce or eliminate peeling.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a device substrate having a front side and a back side corresponding to a front side and a back side of the semiconductor device;
   forming, on the front side of the device substrate, a metal feature;
   forming, on the back side of the device substrate, an insulating layer;
   forming, on the back side of the semiconductor device, a trench exposing the metal feature;
   forming a bonding pad in the trench in electrical communication with the metal feature; and
   forming, on the insulating layer, a metal shield comprising a top surface and a bottom surface, wherein the bottom surface does not extend into the substrate, in which the metal shield and the bonding pad have different thicknesses relative to each other.

2. The method of claim 1, wherein the bonding pad is formed before the metal shield is formed.

3. The method of claim 1, wherein the bonding pad is formed after the metal shield is formed.

4. The method of claim 1, further comprising, before forming the insulating layer, bonding a carrier substrate to the front side of the device substrate.

5. The method of claim 1, further comprising, forming, on the front side of the device substrate, a first passivation layer.

6. The method of claim 5, further comprising:
   forming, on the back side of the device substrate, a second passivation layer, wherein the second passivation layer overlays the bonding pad and the metal shield; and
   etching the second passivation layer to expose the bonding pad.

7. The method of claim 1, further comprising, forming, on the front side of the device substrate, a sensor operable to sense radiation projected toward the back side of the semiconductor device.

8. The method of claim 7, further comprising:
   forming a color filter over the sensor; and
   forming a microlens over the color filter and sensor.

9. A method for forming a semiconductor device, the method comprising:

forming a device substrate having a front side and a back side corresponding to a front side and a back side of the semiconductor device;

forming a metal feature on the front side of the device substrate;

forming a bonding pad on the back side of the semiconductor device and in electrical communication with the metal feature;

forming a shield structure on the back side of the device substrate in which the shield structure and the bonding pad have different thicknesses relative to each other;

forming a first passivation layer over the shield structure and directly over the bonding pad; and forming an insulating layer such that the shield structure is formed over the insulating layer, and wherein the shield structure does not contact the device substrate.

10. The method of claim 9, further comprising:

forming a radiation-sensing region disposed in the device substrate, the radiation-sensing region being operable to sense radiation projected toward the radiation-sensing region from the back side of the device substrate;

forming a second passivation layer disposed on the front side of the semiconductor device; and bonding a carrier substrate to the second passivation layer.

11. The method of claim 10, further comprising, forming a second buffer layer over the back side of the device substrate such that the second buffer layer is interposed between the first buffer layer and the first passivation layer.

12. The method of claim 9, wherein the bonding pad is thicker than the shield structure.

13. The method of claim 9, wherein the bonding pad and the shield structure include a material selected from the group consisting of aluminum, copper, aluminum-copper, titanium, tantalum, titanium nitride, tantalum nitride, and tungsten.

14. The method of claim 9, wherein the shield structure and the bonding pad comprise different materials.

15. A method for forming a semiconductor device, the method comprising:

providing a substrate having a bonding region and a non-bonding region and having a front side and a back side;

forming a metal feature on the front side of the substrate;

forming a first conductive material within a trench on the back side of the semiconductor device in the bonding region, wherein the first conductive material is in electrical communication with the metal feature, and wherein the first conductive material has a first thickness;

forming an insulating layer on the back side of the substrate;

forming a second conductive material on the insulating layer in the non-bonding region, the second conductive material comprising a top surface and a bottom surface, wherein the bottom surface does not extend into the substrate, in which the second conductive material has a second thickness, and in which the first thickness is different from the second thickness; and forming a first passivation layer over the first conductive material and over the second conductive material.

16. The method of claim 15, wherein the semiconductor device comprises a back-side illuminated image sensor device.

17. The method of claim 15, further comprising forming a second passivation layer on the front side of the substrate, wherein the second passivation layer includes a material selected from the group consisting of silicon oxide and silicon nitride.

18. The method of claim 15, further comprising forming a radiation-sensing region in the non-bonding region and having at least one image sensor.

19. The method of claim 15, in which the first and second conductive materials each include a material selected from the group consisting of aluminum, copper, aluminum-copper, titanium, tantalum, titanium nitride, tantalum nitride, and tungsten.

20. The method of claim 15, wherein the first and second conductive materials comprise different materials.

* * * * *